United States Patent [19]

Pucel

[11] 4,163,984
[45] Aug. 7, 1979

[54] FIELD EFFECT TRANSISTOR

[75] Inventor: Robert A. Pucel, Needham, Mass.

[73] Assignee: Raytheon Company, Lexington, Mass.

[21] Appl. No.: 873,189

[22] Filed: Jan. 27, 1978

[51] Int. Cl.$^2$ ............................................. H01L 29/80
[52] U.S. Cl. ....................................... 357/22; 357/23; 357/90; 357/91
[58] Field of Search .......................... 357/22, 23, 90, 91

[56] References Cited

U.S. PATENT DOCUMENTS

| | | | |
|---|---|---|---|
| Re. 28,500 | 4/1972 | Breese et al. ........................... | 357/22 |
| 4,000,504 | 12/1976 | Berger ..................................... | 357/91 |

*Primary Examiner*—Edward J. Wojciechowicz
*Attorney, Agent, or Firm*—Richard M. Sharkansky; Joseph D. Pannone

[57] ABSTRCT

A field effect transistor having a doping concentration profile selected to linearize the relationship between the transconductance of the transistor and the level of a gate voltage fed to the gate electrode of such transistor over the operating range of such voltage. A first doping concentration profile is "spike-shaped" so that the bottom of the depletion zone and hence the transconductance is substantially invariant with gate voltage level. A second doping concentration profile, N(x), varies substantially as $1/x^3$ (where x is the depth from the surface of the transistor) over the operating range of the bottom of the depletion zone.

8 Claims, 3 Drawing Figures

FIELD EFFECT TRANSISTOR

BACKGROUND OF THE INVENTION

This invention relates generally to field effect transistors and more particularly to field effect transistors adapted to linearly amplify signals with minimum distortion and operate at relatively high power levels.

As is known in the art, field effect transistors (FETS), such as gallium arsenide ($G_aA_s$) FETS have been used in a variety of applications to amplify radio frequency signals. Such devices operate in response to a modulating signal fed to the gate electrode of such device. This modulating signal changes the "depth" of the bottom edge of a depletion zone which is produced by such signal in the gate region of the device. The drain current flowing from the source region, through the gate region, to the drain region is related to the depth of the bottom edge of the depletion zone and hence is related to the modulating signal. Consequently, changes in the gate voltage produce changes in the drain current. The ratio of a small change in drain current produced by a small change in gate voltage when the source-gate potential is varied about a nominal operating level is defined as the transconductance, gm, of the device.

When such devices are to operate at relatively large power levels, i.e. near the saturation point of the device, the nonlinear dynamic transfer characteristic of the device produces distortions, such as third order intermodulation products, which limit the power handling capability of the device in linearly amplifying signals.

SUMMARY OF THE INVENTION

In accordance with the present invention a field effect transistor is provided having a doping concentration profile selected to linearize the relationship between the transconductance of the transistor and the level of a voltage fed to the gate electrode of such transistor over the operating range of such voltage.

A first doping concentration profile is shaped to have a significantly larger doping concentration at a predetermined depth from the surface of the device compared with the doping concentration from the surface to such depth. With such profile the bottom of the depletion zone is substantially invariant with gate voltage level and hence the transconductance is invariant with gate voltage level. The invariability of the transconductance eliminates the production of third order intermodulation and linearizes the amplification of the device when operating at relatively large power levels. One such doping concentration profile is a "spike"-shaped profile where the doping concentration increases an order of magnitude with a change in depth in the order of less than 0.5 $\mu$m.

A second doping concentration profile has a doping concentration which decreases as a function of distance from the surface of the transistor. In particular, a doping concentration which varies, substantially, inversely with the third power of such depth over the operating range of the bottom edge of the depletion zone. Such a doping concentration profile provides a transconductance, gm, which varies linearly with gate voltage level. Consequently, third order intermodulation components are substantially eliminated during operation of the transistor.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENTS

Figure 1:
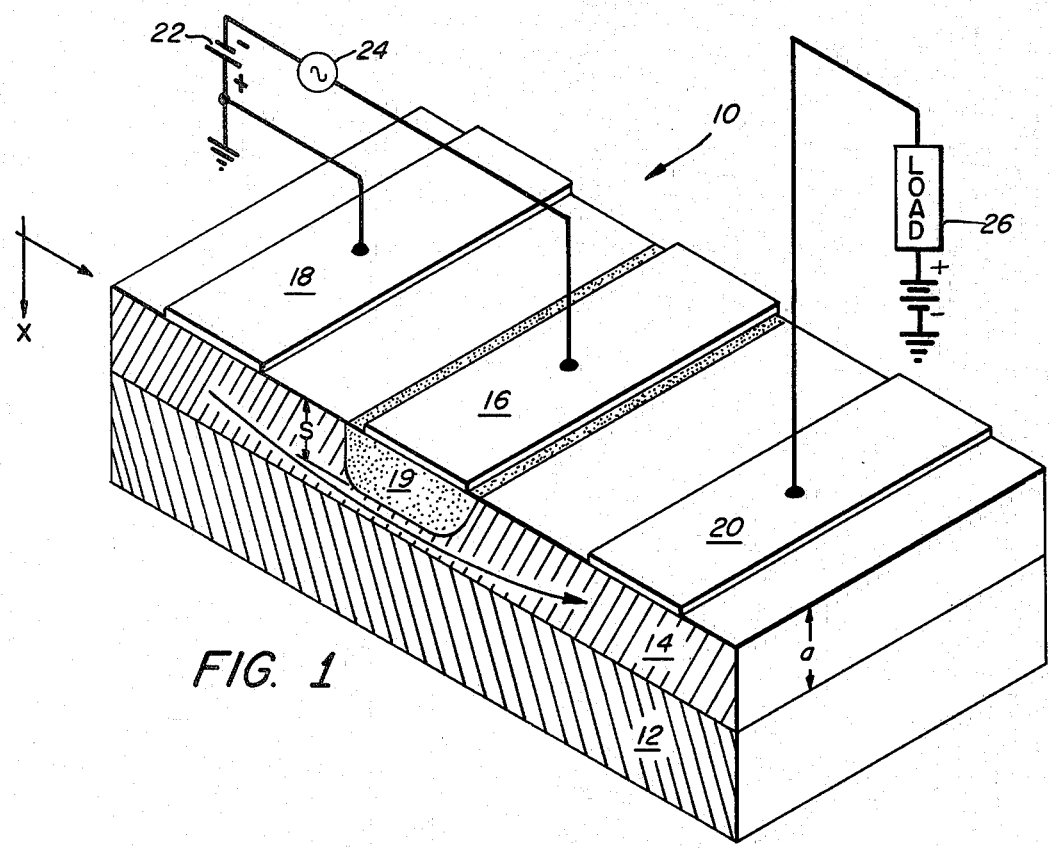
FIG. 1 is a cross-sectional diagrammatical sketch showing a field effect transistor having a doping concentration profile according to the invention.

Referring now to FIG. 1, a field effect transistor (FET) 10 is shown to include a substrate 12, here gallium arsenide, semiinsulating substrate, having a resistivity here in the order of 10 ohm-cm formed in a conventional manner. The thickness of the substrate 12 is typically 2 to 12 mils. A conducting semiconductor layer 14 is grown on the substrate 12 by any conventional method, here by vapor epitaxial growth techniques. Alternatively, ion implantation techniques may be used to form such conducting layer. The doping profile of the epitaxial layer 14 will be discussed later; suffice it to say here, however, that such epitaxial layer here is n type conductivity for $G_aA_s$. Gate, source and drain contacts 16, 18, 20 are formed over a surface of the epitaxial layer 14 using, for example, conventional planar techniques. The source and drain contacts 18, 20 are gold-germanium alloy contacts, for example, which provide an ohmic connection to the epitaxial layer 14. The gate contact 16 is here gold or aluminum or any other suitable metal, such as platinum, having a length in the order of 1 $\mu$m in the direction of current flow, but is formed in a conventional manner as a rectifying metal-semiconductor junction or Schottky junction with the epitaxial layer 14 rather than in ohmic contact with such layer 14. Because the gate contact 16 forms a rectifying junction with the epitaxial layer 14, the portion 19 of the epitaxial layer under the gate contact 16 is depleted of electrons when a negative voltage from supply 22 is produced between the gate and source contacts. The depth or bottom edge of this electron depleted zone (i.e. depletion zone) increases as the reverse bias voltage increases. By superimposing a signal voltage on the gate electrode 16, as from a suitable RF (radio frequency) source 24, here in the microwave band, for example in the order of 10 GHz, a modulation of the depth of the depletion zone is produced. (It is also noted that such modulation also modulates the height of the conducting region below the gate, such region sometimes being referred to as the channel.) Because of the modulation in the depth of the depletion zone the source-drain current is correspondingly modulated because the cross-sectional area presented to the electron flow is modulated. Since the gate contact 16 is reverse-biased, a high impedance is presented to the modulating signal. Because the source-drain current is predominately ohmic conduction, more power is generated by the modulated drain current passing through the load 26 than is consumed by the gate source input impedance.

The voltage on the gate contact 16 may be represented as:

$$V_g = \overline{V}_g + v_g \tag{1}$$

where
$\overline{V}_g$ is the gate bias voltage produced by supply 22; and $v_g$ is the signal produced by source 24. The drain current may be represented as:

$$I_d = \overline{I}_d + i_d \qquad (2)$$

where
$\overline{I}_d$ is the current produced by the voltage $\overline{V}_g$ and
$i_d$ is the current produced in response to the voltage $v_g$.

Expanding Eq. (2) in accordance with the Taylor series expansion:

$$I_d = \overline{I}_d + g_m v_g + \frac{1}{2!} \frac{\delta g_m}{\delta V_g} v_g^2 + \frac{1}{3!} \frac{\delta^2 g_m}{\delta V_g^2} v_g^3 \qquad (3)$$

where $g_m$ is the transconductance $\partial I_d / \partial V_g$ about the nominal operating point: $\overline{I}_d, \overline{V}_g$.

While it is desired that the transistor amplify linearly and distortion-free, the terms $$\frac{\delta^n g_m}{\delta V_g^n}, \text{ where } n = 1, 2 \ldots$$

in Equation (3) would produce distortion in the amplification which is significant at the higher signal levels. One of the most serious distortions would arise from those terms in Equation (3) which have an odd power dependence on gate voltage, i.e. $\frac{\delta^2 g_m}{\delta V_g^2}, \frac{\delta^4 g_m}{\delta V_g^4}$, etc., because these are the terms which cause gain "compression," that is, reduction of gain with increasing input power, and create signals having frequencies within the normal operating frequency band of the transistor which result by mixing the input signal and a nearby interfering signal. Also, the mixing process transfers modulation from the interfering signal to the input signal. The most significant troublesome term is that term which depends on $v_g^3$, i.e. $\frac{\delta^2 g_m}{\delta V_g^2}$, because it generates third order modulation products.

In order to eliminate such higher order terms in the Taylor series expansion:

$$\frac{\delta^n g_m}{\delta V_g^n}, \text{ where } n = 2, 3 \ldots$$

the transconductance, $g_m$, should only be linearly dependent on $V_g$, as represented below:

$$g_m = A - B V_g \qquad (4)$$

where A and B are constants.

Under such conditions all that remains from Eq. (3) is the second order distortion (which will be proportional to B) which represents no significant problem since it does not produce a signal which is within the operating band. Further, if removal of such second order distortion is necessary it can generally be eliminated using a pair of balanced FETS connected in a "push-pull" configuration using circuit techniques well known in the art.

The doping concentration profile of the transistor 10 is selected to linearize the relationship between the transconductance, $g_m$, and the gate voltage according to Eq. (4). To obtain an expression which relates the transconductance to the doping concentration profile consider material such as $G_aA_s$. The electrons will propagate at a velocity which is substantially constant and hence independent of voltages in the normal operating range of the transistor. Such a material then is said to have velocity saturation characteristics. Because of such characteristic the drain current, $I_d$, may, at normal operating conditions, that is, above the "knee" of the $I_d - V_g$ characteristic curve, be represented as:

$$I_d = q V_s W \int_S^a N(x) dx \qquad (5)$$

where:
x is the depth measured from the surface of the epitaxial layer 14;
S is the depth of the depletion zone for normal operating gate bias;
N(x) is the dopant concentration in the epitaxial layer 14 at depth x (atoms/cm$^3$), i.e. the doping concentration profile.
$V_s$ = electron saturation velocity (cm/sec)
q = electron charge (coulombs)
W = gate width (cm)
a = thickness of the semiconductor or epitaxial layer 14.

Further, the gate voltage $V_g$ may be represented as:

$$V_g = -\frac{q}{k\epsilon_o} \int_0^S [x N(x) dx] - \phi \qquad (6)$$

where:
$\phi$ = Schottky barrier "built-in" potential barrier;
K = relative dielectric constant of $G_aA_s$; and
$\epsilon_o$ = the permittivity of free space.

From Equation (6) it should be noted that the depletion depth, S, is an implicit function of the gate bias, which, in turn, imparts a gate bias dependence to the drain current.

The transconductance is defined as $$g_m = \frac{\Delta I_d}{\Delta V_g}\bigg|_{\Delta V_g \to 0} = \frac{d I_d}{d V_g}\bigg|_{\overline{I}_d, \overline{V}_g} \qquad (7)$$

From Eq. (6):

$$\Delta V_g = -\frac{q}{K\epsilon_o} \int_S^{S+\Delta S} x N(x) dx = -S N(S) \Delta S \left(\frac{q}{K\epsilon_o}\right) \qquad (8)$$

and from Eq. (5):

$$\Delta I_d = -q V_s W N(S) \Delta S \qquad (9)$$

Therefore, combining Eqs. (7), (8) and (9):

$$g_m = K \epsilon_o V_s W / S \qquad (10)$$

where S is, from Eq. (6), an implicit function of gate voltage $V_g$.

CASE I

From Eq. (10) it is noted that the transconductance, gm, is inversely proportional to the depth, S, of the depletion zone. From Eq. (4) it is noted that the higher order terms in the Taylor Expansion Series may be removed if gm is made invariant with gate voltage, i.e. B=O. These conditions may be satisfied with a doping step in the channel, at some position $x=S_o$, say near the interface between the channel and the substrate (or buffer layer if one is present). That is, a doping concentration profile:

$$N(x) = N_1$$

where $S_o > x \geq 0$ and $N(x) = N_2$ when $x \geq S_o$ where $N_1 << N_2$. With such doping concentration profile, the bottom of the depletion zone will be substantially independent of gate voltage, $V_g$, and will be located substantially at the depth $S_o$. Because the bottom of the depletion zone, S, is invariant with gate voltage $V_g$ from Equation (10) the transconductance, gm, is constant = $K\epsilon_o V_s W/S_o$ and hence from Eq. (4) $gm = A = K\epsilon_o V_s W/S_o$ thereby eliminating higher order terms $$\frac{\delta^n gm}{\delta V_g^n} \text{ where } n = 1, 2, 3 \ldots$$

Figure 2:
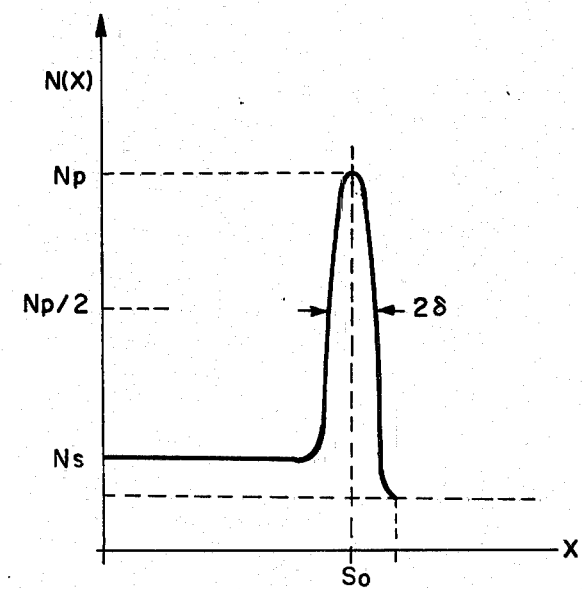
FIG. 2 shows a "spike-shaped" doping concentration profile according to the invention.

In practice, of course, a perfect step-shaped profile is not attainable. This is because the doping concentration must eventually drop down to the level of the substrate doping level (here in the order of $10^7$ atoms/cm$^3$) or to the concentration of the buffer layer, if any, (typically $10^{13}$ atoms/cm$^3$). Therefore, in practice a "spike" is produced rather than a step. One profile which substantially approximates such "spike" is shown in FIG. 2. Such a doping concentration profile may be obtained using any conventional process such as adding dopant at specific times during an epitaxial growth of the epitaxial layer 14 or by ion implantation techniques or a combination of both. A doping concentration of $N_s$ at the surface of the order of $10^{16}$ atoms/cm$^3$; a peak doping concentration $N_p = 10^{17}$ to $5 \times 10^{17}$ atoms/cm$^3$; a spike width $2\delta = 0.10$ μm to 0.5 μm therefore is used for one embodiment of the transistor 10 (FIG. 1). That is, the doping concentration increases an order of magnitude with a change in depth in the order of 0.5 μm. Here the dopant is silicon atoms.

CASE II

From Equation (10), $gm = K\epsilon_o V_s W/S$ where S is an implicit function of $V_g$ from Equation (6). As discussed, in order to remove higher order terms in the Taylor Expansion Series the transconductance gm should only be linearly dependent on $V_g$ as given by Equation (4). Therefore, from Eqs. (4), (6) and (10), to remove the higher order terms in the Taylor Expansion Series:

$$gm = A - B\, V_g = K\epsilon_o V_s W/S \tag{11}$$

where $V_g$ and S are related by Equation (6):

$$V_g = -\frac{q}{K\epsilon_o} \int_0^S [x\, N(x)\,dx] - \phi$$

It should be noted that Equation (11) is satisfied if the doping concentration profile, $N(x)$, is:

$$N(x) = f(x) \quad 0 \leq x \leq x_1 \tag{12}$$

$$= c/x_1^3 \quad x_1 < x$$

where
C is a constant
$x_1$ is the extreme lower limit of the bottom of the depletion zone corresponding to the instantaneous gate voltage, $V_g(t)$, being least negative (for an n type channel) over the operating range of the device; and
$f(x)$ is an arbitrary doping concentration profile for $x \leq x_1$ which is chosen to satisfy some other design consideration such as a tradeoff between low source and drain contact resistance (i.e. high doping concentration) and high gate-drain avalanche breakdown voltage (i.e. low doping concentration).

It is noted from Eq. (12) that:

$$f(x)\bigg|_{x=x_1} = C/x_1^3 \tag{13}$$

Combining Eqs. (6), (12) and (13):

$$V_g = -\left\{\frac{q}{K\epsilon_o} \int_0^{x_1} xf(x)dx + x_1^2 f(x_1)\right\} - \phi + \frac{qx_1^3 f(x_1)}{K\epsilon_o S} \tag{14}$$

Hence, Eq. (14) may be written as:

$$V_g = K_1 + K_2/S \tag{15}$$

where $K_1 = -\frac{q}{K\epsilon_o}\left[\int_0^{x_1} xf(x)dx + x_1^2 f(x_1)\right] - \phi;$ $K_2 = qx_1^3 f(x_1)/k\epsilon_o$ Substituting Eq. (15) into Eq. (11):

$$gm = A - B\,[K_1 + K_2/S] = K\epsilon_o V_s W/S \tag{16}$$

The relationship set forth in Eq. (16) is, therefore, satisfied (i.e. higher order terms in the Taylor Expansion Series removed) if:

$A = -K\epsilon_o V_s W\, K_1/K_2 = $ constant $B = -K\epsilon_o V_s W/K_2 = $ constant Consider the following doping concentration profile:

$N(x) = C/x_1^3 \quad 0 \leq x \leq x_1$ $= C/x^3 \quad x_1 < x$

From Eq. (14):

$$V_g = -\frac{q}{K\epsilon_0}\left(\frac{3}{2}\right)\frac{C}{x_1} - \phi + \frac{q}{K\epsilon_0}\frac{C}{S} \quad (17)$$

$$= K_1 + K_2/S$$

where $K_1 = -\frac{q}{K\epsilon_0}\left(\frac{3}{2}\right)\frac{C}{x_1} - \phi$ and $K_2 = \frac{qC}{K\epsilon_0}$ Substituting Eq. (17) into Eq. (11):

$$gm = A - B[K_1 + K_2/S] = K\epsilon_0 V_s W/S$$

which is satisfied when:

$$A = \frac{3}{2}\frac{K\epsilon_0 V_s W}{x_1} + \frac{K^2\epsilon_0^2 V_s w}{qC}\phi = \text{constant}$$

and $B = \frac{-K^2\epsilon_0^2 V_s W}{qC} = \text{constant}$

Consequently, with a doping concentration profile, $N(x)$ where:

$$N(x) = C/x_1^3 \quad 0 \leq x \leq x_1$$

$$= C/x^3 \quad x_1 < x$$

the transconductance, gm, is of the form $$gm = \frac{K\epsilon_0 W V_s}{S} = A - B V_g$$

and the higher order terms of the Taylor Expansion Series are removed.

A doping concentration profile $N(x)$ which varies approximately as (constant/$x^3$) for $x_1 < x$ is $$N(x) = \frac{N_s}{1 + (x/\delta_1)^3} \quad (18)$$

Figure 3:
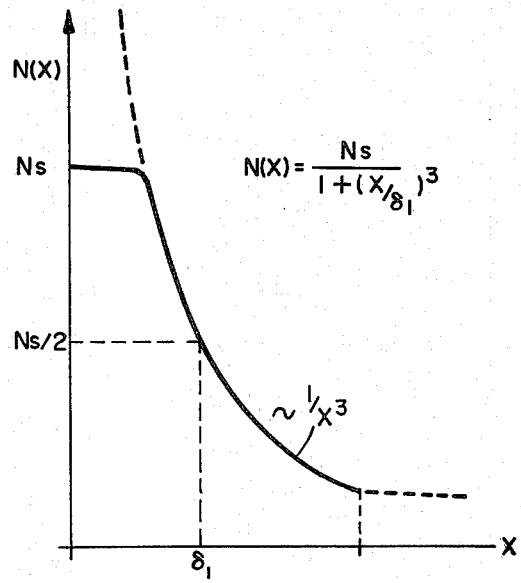
FIG. 3 shows an alternative doping concentration profile according to the invention.

Such profile is shown in FIG. 3.

Here $\delta_1$ is in the order of 0.05 to 0.2 μm, $N_s$ is in the order of $5 \times 10^{16}$ to $5 \times 10^{17}$ atoms/cm$^3$ and the thickness of the epitaxial, a, is in the order of 0.2 to 0.07 μm. The bottom of the depletion zone is biased to a depth greater than $\delta_1$ such that during normal operating the bottom of the depletion zone never falls within $x < 2\delta_1$. Here the dopant is silicon atoms. Here again the doping concentration profile $N(x)$ as set forth in Eq. (18) above may be obtained using any conventional process such as adding dopant at specific times during the epitaxial growth of the epitaxial layer 14 or by ion implantation techniques or a combination of both.

Having described preferred embodiments of this invention, it is now evident that other embodiments incorporating these concepts may be used. For example, while silicon has been used as the dopant, other elements such as seleniun or tin may be used. Further, a buffer layer of semi-insulating material or lightly doped layer may be used between the substrate and the channel region. Still further, while $G_aA_s$ has been used for the substrate, other velocity saturation materials such as InP may be used. It is felt, therefore, that this invention should not be restricted to the disclosed embodiments, but rather should be limited only by the spirit and scope of the appended claims.

What is claimed is:

1. A field effect transistor comprising:
   (a) a semiconductor layer formed over a substrate;
   (b) a gate electrode disposed between a source electrode and a drain electrode, such gate, source and drain electrodes being disposed over a portion of a surface of the semiconductor layer, such gate electrode being adapted to produce a depletion zone in a portion of such semiconductor layer in response to an electrical voltage between the source and gate electrodes;
   (c) such semiconductor layer having a dopant in the semiconductor layer beneath the gate electrode, such dopant having a doping concentration profile selected to linearize the relationship between the transconductance and the level of the electrical voltage fed to the gate electrode to such transistor over the operating range of such electrical voltage.

2. The field effect transistor recited in claim 1 wherein the doping concentration profile has a significantly larger doping concentration level at a predetermined depth from the surface of the transistor than the doping concentration levels from such surface to such depth.

3. The field effect transistor recited in claim 2 wherein the doping concentration profile is "spike-shaped".

4. The field effect transistor recited in claim 2 wherein the doping concentration level increases an order of magnitude with a change in depth in the order of less than 0.5 μm at the predetermined depth.

5. The field effect transistor recited in claim 1 wherein the doping concentration profile has a doping concentration level which decreases as a function of depth from the surface of the transistor.

6. The field effect transistor recited in claim 5 wherein the doping concentration profile decreases substantially inversely as the third power of depth over the operating range of the bottom edge of the depletion zone of the transistor.

7. The field effect transistor recited in claim 6 wherein the doping concentration profile $N(x)$ is substantially related to the depth, x, from the surface of the transistor according to $$N(x) = N_s/1 + (x/\delta_1)^3$$

where $N_s$ and $\delta_1$ are constants.

8. A field effect transistor comprising:
   (a) a semiconductor layer formed over a substrate;
   (b) a gate electrode disposed between a source electrode and a drain electrode, such gate, source and drain electrodes being disposed over a portion of a surface of the semiconductor layer;
   (c) such semiconductor layer having a dopant in the semiconductor layer beneath the gate electrode, such dopant having a doping concentration profile $N(x)$ substantially according to:

$$N(x) = N_s/(1 + (x/\delta_1)^3)$$

where x is the depth of the concentration from the surface of the layer; $\delta_1$ is a constant; and $N_s$ is a constant.

* * * * *